United States Patent
Doi (10) Patent No.: US 6,872,603 B2
(45) Date of Patent: Mar. 29, 2005

(54) METHOD FOR FORMING INTERCONNECTIONS INCLUDING MULTI-LAYER METAL FILM STACK FOR IMPROVING CORROSION AND HEAT RESISTANCES

(75) Inventor: Satoshi Doi, Kagoshima (JP)

(73) Assignee: NEC LCD Technologies, Ltd., Kawasaki (JP)

( * ) Notice: Subject to any disclaimer, the term of this patent is extended or adjusted under 35 U.S.C. 154(b) by 0 days.

(21) Appl. No.: 10/705,864

(22) Filed: Nov. 13, 2003

(65) Prior Publication Data

US 2004/0097024 A1 May 20, 2004

(30) Foreign Application Priority Data

Nov. 15, 2002 (JP) ........................................ 2002/332485

(51) Int. Cl.⁷ .......................... H01L 21/00; H01L 21/44; H01L 21/302
(52) U.S. Cl. ........................ 438/149; 438/685; 438/689
(58) Field of Search ........................ 438/30, 149, 685, 438/689

(56) References Cited

U.S. PATENT DOCUMENTS 6,362,027 B1 * 3/2002 Yamazaki et al. .......... 438/149

6,514,804 B1 * 2/2003 Yamaguchi ................. 438/164

FOREIGN PATENT DOCUMENTS

| JP | 8-62628 | 3/1996 | ........... G02F/1/136 |
| JP | 2000-252473 | 9/2000 | ......... H01L/29/786 |
| JP | 2002-26335 | 1/2002 | ......... H01L/29/786 |
| JP | 2002-90774 | 3/2002 | ......... G02F/11/368 |
| JP | 2002-198360 | 7/2002 | ....... H01L/21/3065 |

* cited by examiner

*Primary Examiner*—Olik Chaudhuri
*Assistant Examiner*—William M. Brewster
(74) *Attorney, Agent, or Firm*—McGinn & Gibb, PLLC (57) ABSTRACT

A method of fabricating a semiconductor device including an interconnection is provided. The method is composed of covering a substrate with a metal film stack including a lower refractory metal film over the substrate, a lower protective layer of a first compound including metal disposed on an upper surface of the lower refractory metal film, a core metal film of the metal on an upper surface of the lower protective layer, an upper protective layer of a second compound including the metal disposed on an upper surface of the core metal film, and an upper refractory metal film disposed on an upper surface of the upper protective layer, patterning the metal film stack; and forming a side protective layer of a third compound including the metal on a side of the patterned core metal film.

14 Claims, 7 Drawing Sheets

METHOD FOR FORMING INTERCONNECTIONS INCLUDING MULTI-LAYER METAL FILM STACK FOR IMPROVING CORROSION AND HEAT RESISTANCES

BACKGROUND OF THE INVENTION

1. Field of the Invention

The present invention is generally related to a method of fabricating interconnections including a multi-layer metal film stack, particularly, to an improvement in corrosion and heat resistances of interconnections.

2. Description of the Related Art

TFT (thin film transistor) apparatuses, such as LCDs (liquid crystal displays), require low resistivity interconnections with high corrosion and heat resistances. A technique for fabricating such interconnections is disclosed in Japanese Patent Application No. Jp-A-Heisei 8-62628. The disclosed technique involves forming a refractory metal film, oxidizing the surface of the refractory metal film, forming an aluminum film on the oxidized surface, oxidizing the upper surface of the aluminum film, forming another refractory metal film on the oxidized surface of the aluminum film to complete a film stack, patterning the film stack, and oxidizing sides of the film stack. The oxides effectively avoids the aluminum film being corroded by stripping agent for stripping off resist patterns used as a mask.

Japanese Patent Application No. P2000-26335A discloses an interconnections structure composed of an aluminum film sandwiched by a pair of refractory metal films. Oxygen including aluminum films are disposed between the aluminum film and refractory metal films to prevent thermally induced counter diffusion between the aluminum film and refractory metal films.

Japanese Patent Application No. P2002-198360 discloses an etching technique for etching a structure including a silicon layer, and an aluminum layer disposed on the upper surface of the silicon layer. The disclosed etching technique involves etching the aluminum layer with $Cl_2$ gas and $H_2$ gas, and etching the silicon layer with $SF_6$ gas, and HCl gas and He gas. The document also discloses the use of $Cl_2$ gas in place of the HCl gas.

Japanese Patent Application No. P2002-90774A discloses a LCD fabrication process to reduce deterioration of liquid crystal within cells caused by pollution with material of gate electrodes. The disclosed process involves successively depositing an aluminum layer and a molybdenum layer, partially etching the molybdenum layer in an effective display region of the display panel, and oxidizing the aluminum layer in the effective display region through an anodization technique to complete the gate electrodes.

Japanese Patent Application No. 2000-252473 discloses a TFT structure for achieving low resistivity ohmic contact onto gate electrodes. The disclosed TFT structure is composed of gate electrodes including first through third metal layers, the first metal layer being formed of refractory metal such as Ta, Hf, Nb, and Zr, the second metal layer being formed of low resistivity metal such as Al, Ti, Cu, Cr, W, and Mo, and the third metal layer being formed of refractory metal such as Ta, Hf, Nb, and Zr.

SUMMARY OF THE INVENTION

In summary, the present invention addresses an improvement in corrosion and heat resistances of interconnections, especially those integrated within TFT devices.

In an aspect of the present invention, a method of fabricating a semiconductor device including an interconnection is composed of:

forming a metal film stack to cover a substrate; the film stack including:
- a lower refractory metal film over the substrate,
- a lower protective layer of a first compound including metal disposed on an upper surface of the lower refractory metal film,
- a core metal film of the metal on an upper surface of the lower protective layer,
- an upper protective layer of a second compound including the metal disposed on an upper surface of the core metal film, and
- an upper refractory metal film disposed on an upper surface of the upper protective layer;

patterning the metal film stack; and forming a side protective layer of a third compound including the metal on a side of the patterned core metal film.

At least one of the first, second, and third compounds may be oxide, nitride, or oxynitride of the metal.

In the event that the metal is selected from among the group consisting of aluminum and aluminum alloy, the first, second, and third compounds are preferably selected from the group consisting of oxide, nitride, and oxynitride of the metal.

For copper, silver, and an alloy thereof, by contrast, the first, second, and third compounds are preferably selected from the group consisting of nitride, and oxynitride of the metal.

The patterning may include:
- forming a resist pattern on the metal film stack, and
- etching the metal film stack using the resist pattern as a mask, the formation of the side protective layer being implemented before the resist pattern is stripped off.

Alternatively, the patterning may include:
- forming a resist pattern on the metal film stack,
- etching the metal film stack using the resist pattern as a mask, and
- stripping off at least a portion of the resist pattern, the formation of the side protective layer being implemented after the stripping off.

The method may further includes:
- forming a semiconductor film stack to cover the substrate; the semiconductor film stack including a semiconductor layer and a heavily doped semiconductor layer disposed on an upper surface of the semiconductor layer, and the metal film stack being patterned so that the patterned metal film stack overlaps the semiconductor film stack;
- patterning the semiconductor film stack using the patterned film stack as a mask.

When the method includes covering the substrate with a semiconductor film stack including a semiconductor layer and a heavily doped semiconductor layer disposed on an upper surface of the semiconductor layer, and patterning the semiconductor film stack, the patterning the metal film stack may include:
- forming a resist pattern on the metal film stack,
- etching the metal film stack using the resist pattern as a mask so that the patterned metal film stack overlaps the semiconductor film stack, and
- the patterning the semiconductor film stack may be achieved by using the resist pattern as a mask.

The above-mentioned method is especially effective in the case that the patterning the semiconductor film stack is achieved by using an etchant including fluorine and/or chlorine.

DESCRIPTION OF THE PREFERRED EMBODIMENTS

Preferred embodiments of the present invention are described below in detail with reference to the attached drawings.

Figure 1A:
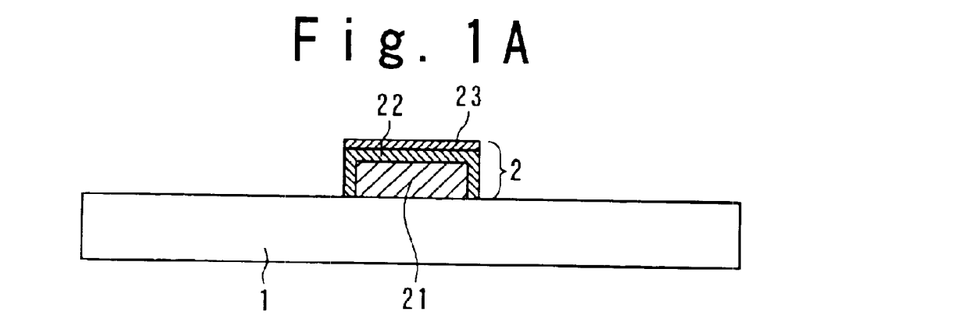
FIGS. 1A through 1F are cross sectional views illustrating a fabrication process of an inversely staggered TFT device in an embodiment of the present invention.

In one embodiment, as shown in FIG. 1A, a process for fabricating a TFT device begins with forming a gate electrode 2 and a scan line (not shown) on a transparent insulating substrate 1. In order to form the gate electrode 2, a core metal film 21 of aluminum is firstly deposited on the substrate 1, and then the surface of the metal film 21 is covered with a thin protective film 22. The protective film 22 may be formed through oxidizing, nitriding, or oxinitriding the surface of the core metal film 21. A refractory metal film 23 of chromium is then deposited on the protective film 22. The core metal film 21, the protective film 22, and the refractory metal film 23 is then patterned. After the patterning, the sides of the patterned core metal film 21 are oxidized, nitrided, or oxinitrided to form thin protective films thereon, which typically have a thickness in the orders of tens or hundreds of nano meters. This completes the gate electrode 2.

Figure 1B:
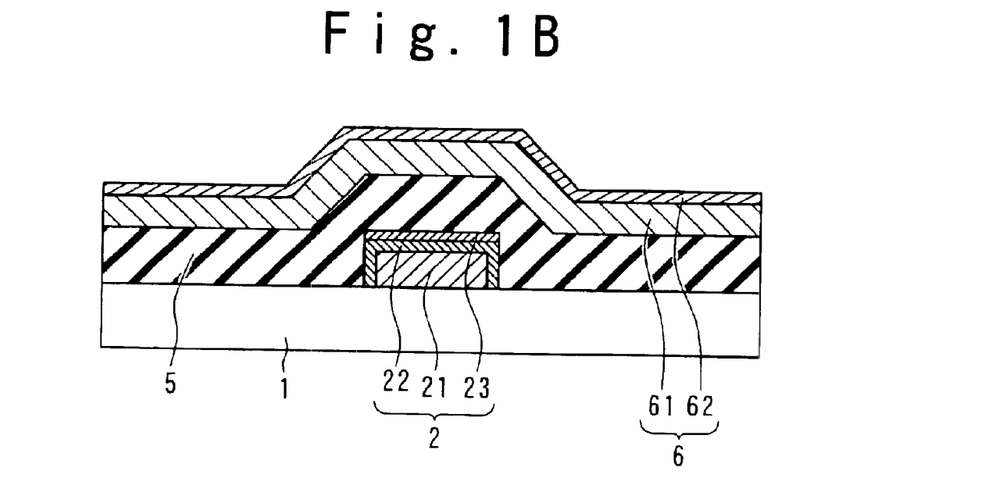

After the gate electrodes 2 are covered with a gate dielectric 5, as shown in FIG. 1B, a semiconductor film stack 6 of an amorphous silicon film 61 and a heavily doped amorphous silicon film 62 is then formed to cover the gate dielectric 5.

Figure 1C:
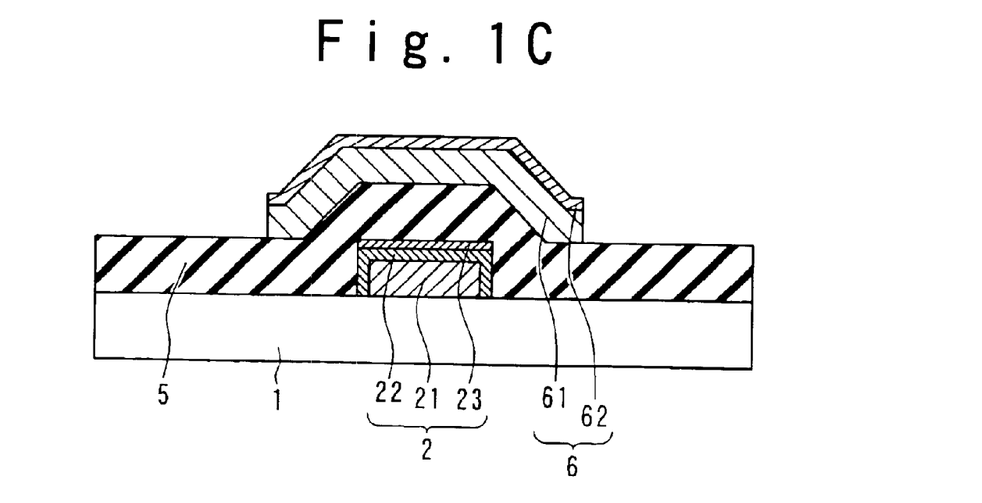

As shown in FIG. 1C, the semiconductor film stack 6 is then patterned to form a semiconductor film stack 6.

Figure 1D:
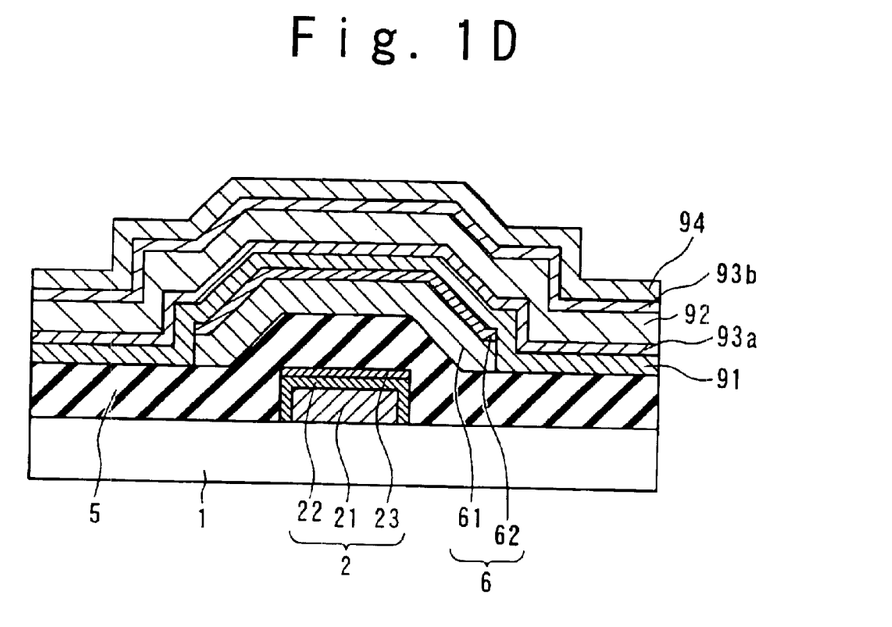

After patterning the semiconductor film stack 6, as shown in FIG. 1D, a metal film stack of a lower refractory metal film 91, a lower protective film 93a, a core metal film 92, an upper protective film 93b, and an upper refractory metal film 94 is then formed to cover the patterned semiconductor film stack 6.

The refractory metal films 91 and 94 are formed of a material selected from the group of chromium (Cr), titanium (Ti), tantalum (Ta), Niobium (Nb), hafnium (Hf), zirconium (Zr), molybdenum (Mo), tungsten (W), alloys thereof, and conductive nitrides thereof, such as titanium nitride.

The core metal film 92 is formed of a low resistivity metal, such as aluminum, copper, silver, and alloys mainly consisting of these metal, such as AlNd.

The protective films 93a and 93b are formed of oxides, nitrides, or oxynitrides of the metal or alloy used as the core metal films 92. In the event that the core metal film 92 is formed of aluminum, or aluminum alloy, any of the oxides, nitrides, or oxynitrides thereof is suitable for the protective films 93a and 93b. For copper, silver, and alloys thereof, by contrast, the use of the oxides as the protective films 93a and 93b is not preferable because of the poor corrosion resistivity thereof.

The lower protective film 93a may be formed through any of three processes described below.

A first process for forming the lower protective film 93a involves oxidizing the upper surface of the lower refractory metal film 91 through plasma modification or $O_2$ annealing after cleaning the upper surface, and depositing the core metal film 92 on the oxidized surface. The oxidized surface of the lower refractory metal film 91 provides oxygen for the bottom portion of the core metal film 92, and thereby completes the lower protective film 93a of an oxide of the core metal film 92.

A second process for forming the lower protective film 93a involves reactive sputtering with a sputtering gas including $O_2$, $N_2$, or $N_2O$ gas as well as Ar gas at the initial deposition stage of the core metal film 92. This achieves deposition of the lower protective film 93a of an oxide, nitride, or oxynitride of the core metal film 92. After the completion of the lower protective film 93a, the sputtering gas is then switched to pure Ar gas to deposit the core metal film 92.

A third process for forming the lower protective film 93a involves depositing the metal used as the core metal film 92, and oxidizing or nitrizing the deposited metal through $O_2$ plasma treatment, $N_2$ plasma treatment, or annealing in an oxidizing atmosphere. The oxidizing or nitrizing is followed by deposition of the core metal film 92.

The upper protective film 93b may be formed by oxidizing or nitrizing the upper surface portion of the core metal film 92 through $O_2$ plasma treatment, $N_2$ plasma treatment, or annealing in an oxidizing atmosphere. Alternatively, the upper protective film 93b may be formed through reactive sputtering with a sputtering gas including $O_2$, $N_2$, or $N_2O$ gas at the final deposition stage of the core metal film 92.

Figure 1E:
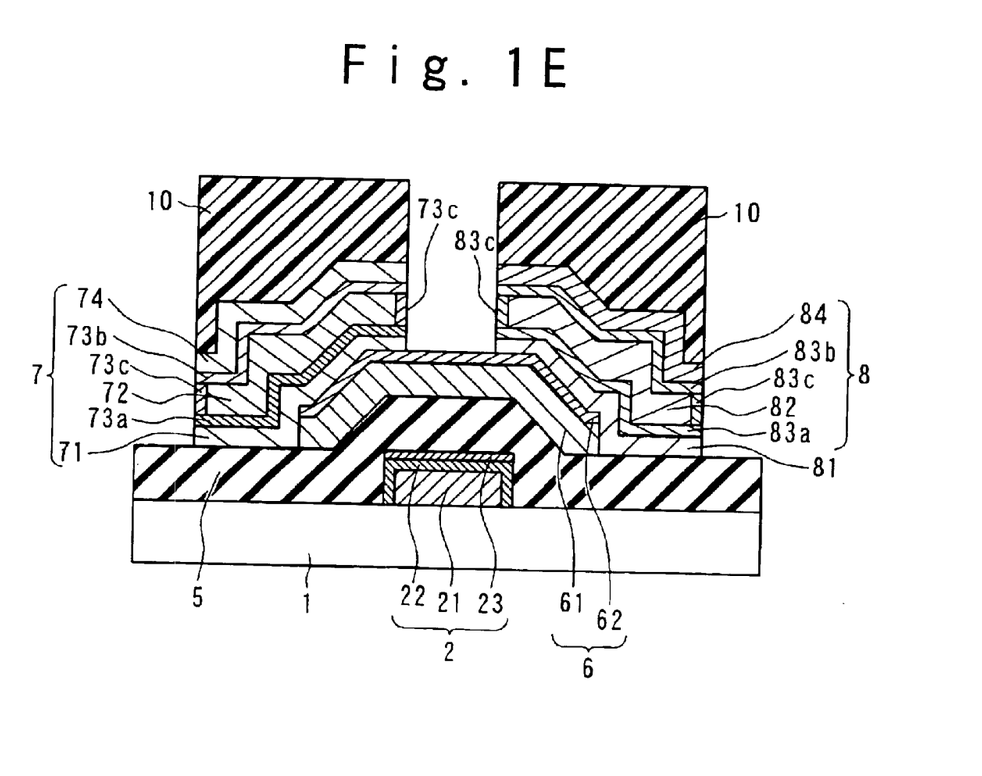

As shown in FIG. 1E, the metal film stack is then patterned through a photolithography technique using a resist pattern 10 as a mask to form source and drain electrodes 7, 8 and data lines (not shown) so that the source and drain electrodes 7, 8 overlap the heavily doped amorphous silicon film 62. The source electrode 7 includes a lower refractory metal layer 71, a lower protective layer 73a, a core metal layer 72, a upper protective layer 73b, and an upper refractory metal layer 74, which are respectively formed from the refractory metal film 91, the lower protective film 93a, the core metal film 92, the upper protective film 93b, and the upper refractory metal film 94. Correspondingly, the drain electrode 8 includes a lower refractory metal layer 81, a lower protective layer 83a, a core metal layer 82, a upper protective layer 83b, and an upper refractory metal layer 84. The patterning of the metal film stack exposes a portion of the heavily doped amorphous silicon film 62 of the semiconductor film stack 6.

After patterning the metal film stack, the side surfaces of the core metal layer 72, and 82 are then oxidized or nitrized through $O_2$ plasma treatment, $N_2$ plasma treatment, or annealing in an oxidizing atmosphere to form side protective layers 73c, and 83c. The lower, upper, and side protective layers 73a, 73b, and 73c may be collectively referred to as a protective layer 73. Correspondingly, the lower, upper, and side protective layers 83a, 83b, and 83c may be collectively referred to as a protective layer 83.

Figure 1F:
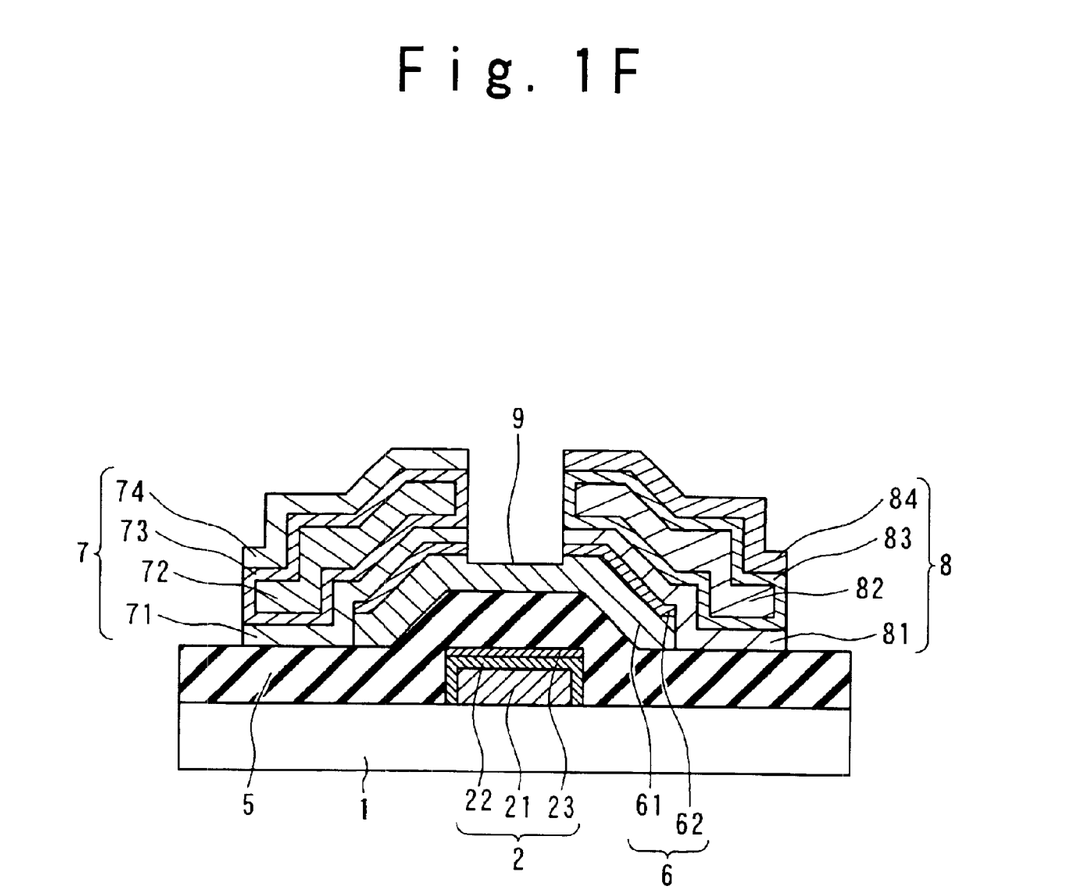

After the resist pattern 10 is stripped off, as shown in FIG. 1F, the exposed portion of the heavily doped amorphous silicon film 62 is dry-etched using the source and drain electrodes 7, 8 as a mask. It should be noted that the surface portion of the amorphous silicon film 61 may be etched by the dry-etching. This dry-etching forms a channel region 9 to complete an inversely staggered TFT. An etchant used for this dry-etching includes fluorine based chemicals, such as fluorocarbon. The etchant may additionally include chlorine based chemicals.

Alternatively, the exposed portion of the heavily doped amorphous layer 62 may etched using the resist mask 10 as a mask. In this case, the resist mask 10 is stripped off after the etching.

The protective layers 73, and 83 effectively avoids the corrosion of the core metal films 72 and 82 during and after the dry-etching using fluorine and/or chlorine based chemicals. The use of fluorine and/or chlorine based chemicals potentially causes corrosion of the sides of the core metal films 72 and 82 during dry-etching. Furthermore, subjecting the device structure to the atmosphere may cause undesirable production of hydrofluoric and/or hydrochloric acids through reaction of residual fluorine and/or chlorine based chemicals and moisture of the atmosphere, and the produced acids potentially corrodes the core metal films 72 and 82. However, the protective layers 73, and 83, which is resistive against chemicals, effectively prevent the core metal films 72, and 83 from being corroded.

In addition, the protective layers 73, and 83, which are disposed between the core metal films and the refractory metal films, effectively prevent the undesirable reaction therebetween, and thereby improve the heat resistance of the interconnections. Improvement of the heat resistance is of much importance for implementing the remaining fabrication processes, typically including heat treatment for stabilizing transistor characteristics, passivation using a plasma chemical vapor deposition, and so forth.

Figure 2A:
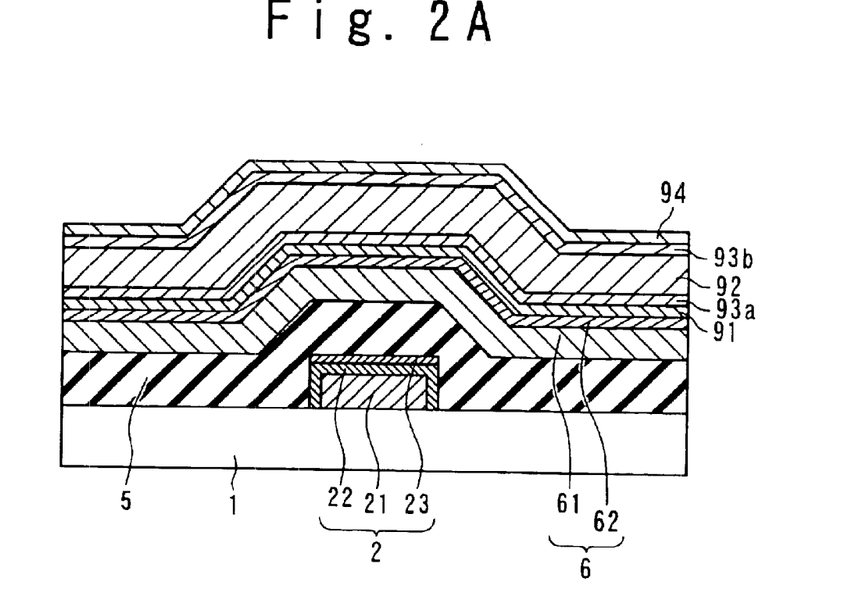
FIGS. 2A through 2G are cross sectional views illustrating a fabrication process in an alternative embodiment.

In another alternative embodiment, as shown in FIG. 2A, the metal film stack of the refractory metal film 91, the lower protective film 93a, the core metal film 92, the upper protective film 93b, and the upper refractory metal film 94 are deposited before patterning the semiconductor film stack 6. As described below, the metal film stack and the semiconductor film stack 6 are then patterned using a single photolithography process. The fabrication process in this embodiment preferably reduces the number of necessary photolithography steps.

Figure 2B:
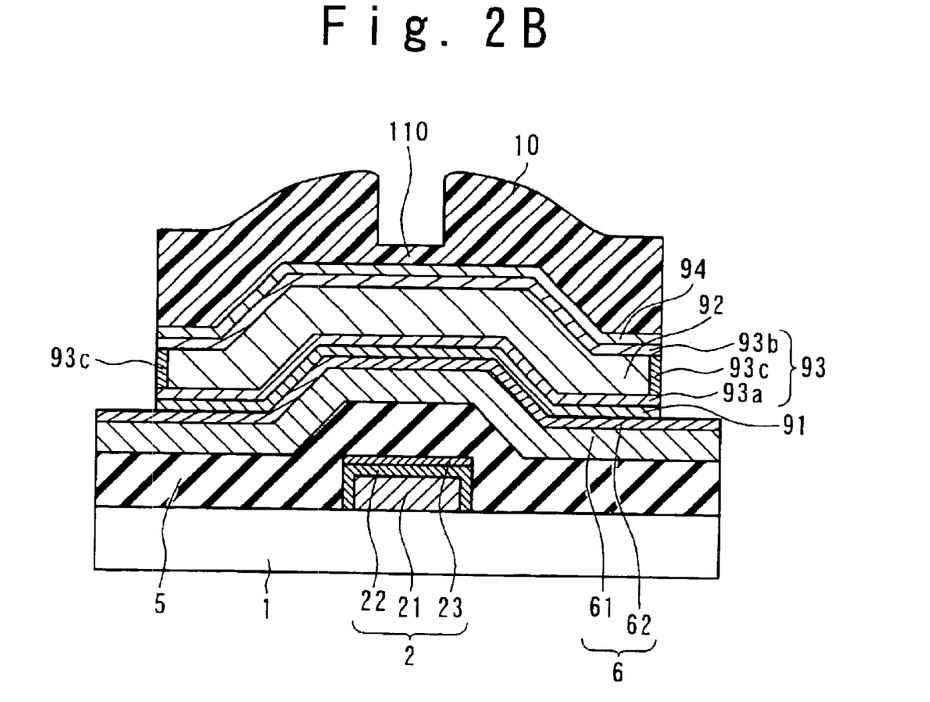

In this embodiment, as shown in FIG. 2B, after depositing the metal film stack, the resist pattern 10 is formed thereon through a photolithography technique using a gray tone mask so that the resist pattern 10 has a thinner portion 110.

The metal stack is then patterned with the resist pattern 10 used as a mask to expose a portion of the semiconductor film stack 6. After patterning the metal stack, the side surfaces of the core metal film 92 are then oxidized or nitrized through $O_2$ plasma treatment, $N_2$ plasma treatment, or annealing in an oxidizing atmosphere to form side protective films 93c.

Figure 2C:
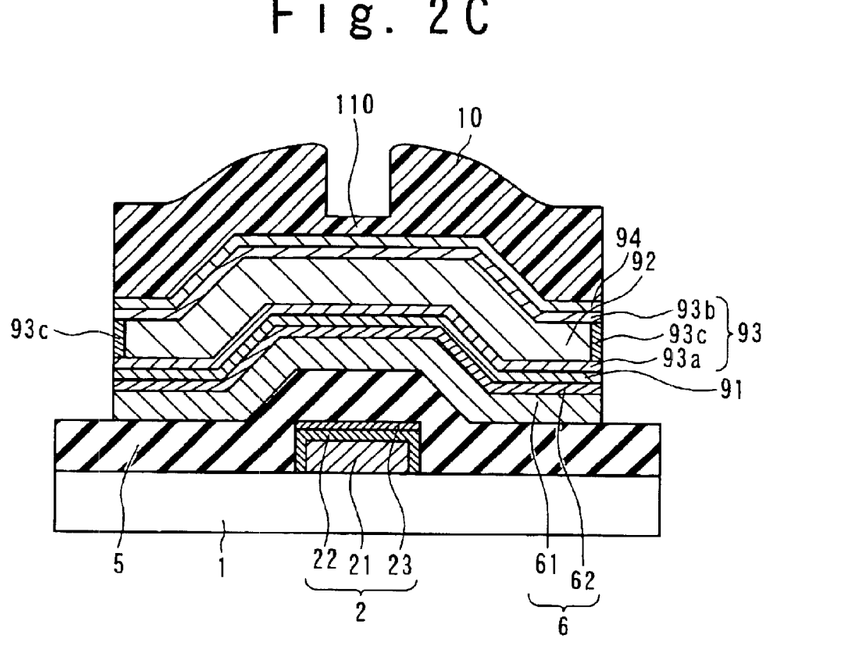

After forming the side protective layers 93c, as shown in FIG. 2C, the semiconductor film stack 6 is then etched with an etchant gas including fluorine based chemicals, such as fluorocarbon, using the resist pattern 10 used as a mask. The etchant may additionally include chlorine based chemicals. As is the case of the protective layers 73 and 83 described before, the protective films 93a, 93b, and 93c effectively avoids corrosion of the core metal film 92 resulting from the fluorine and/or chlorine based chemicals.

Figure 2D:
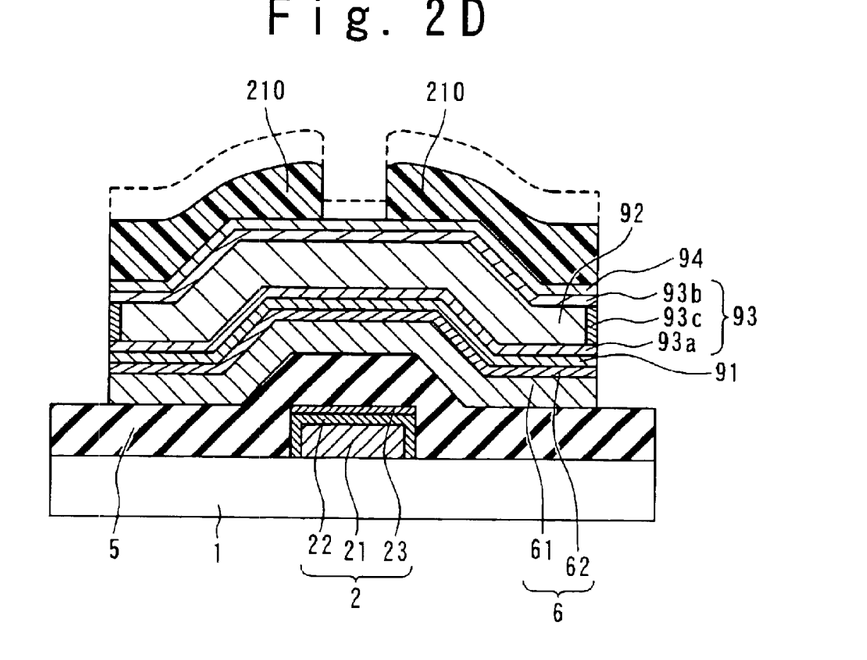

After etching the semiconductor film stack 6, as shown in FIG. 2D, the resist pattern 10 is subjected to ashing to remove the top portion of the resist pattern 10. This ashing exposes a portion of the upper refractory metal film 94 to form a pair of separated resist patterns 210.

Figure 2E:
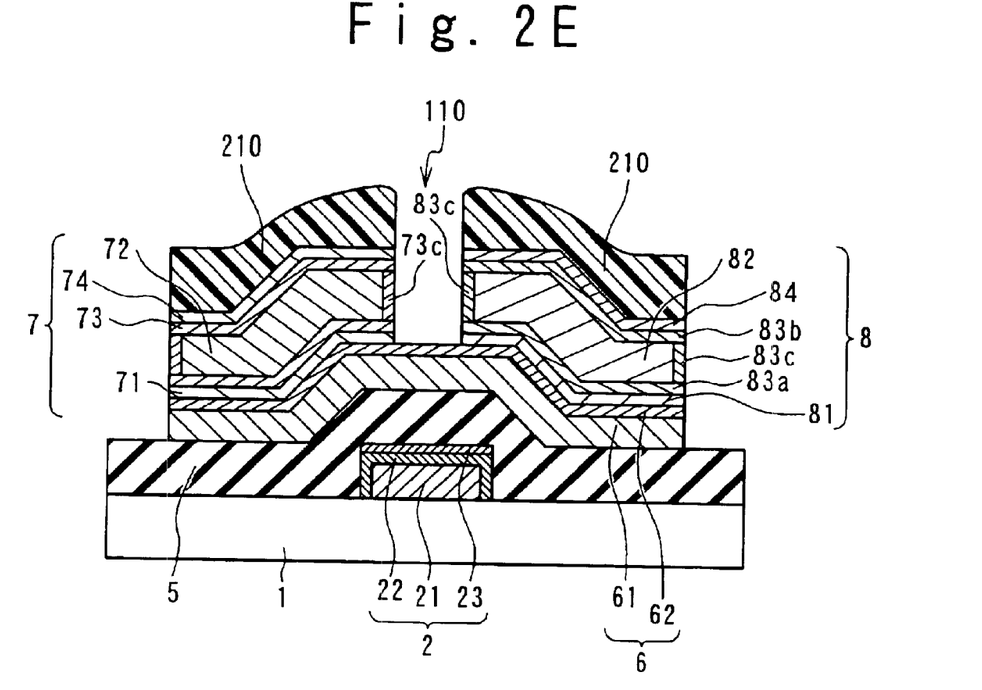

As shown in FIG. 2E, the metal film stack is then patterned to form the source and drain electrodes 7, and 8. This patterning exposes a portion of the heavily doped amorphous silicon film 62 of the semiconductor film stack 6. After patterning the metal film stack, the side surfaces of the core metal layers 72 and 82 are then oxidized or nitrized through $O_2$ plasma treatment, $N_2$ plasma treatment, or annealing in an oxidizing atmosphere to form the protective layers 73c and 83c.

Figure 2F:
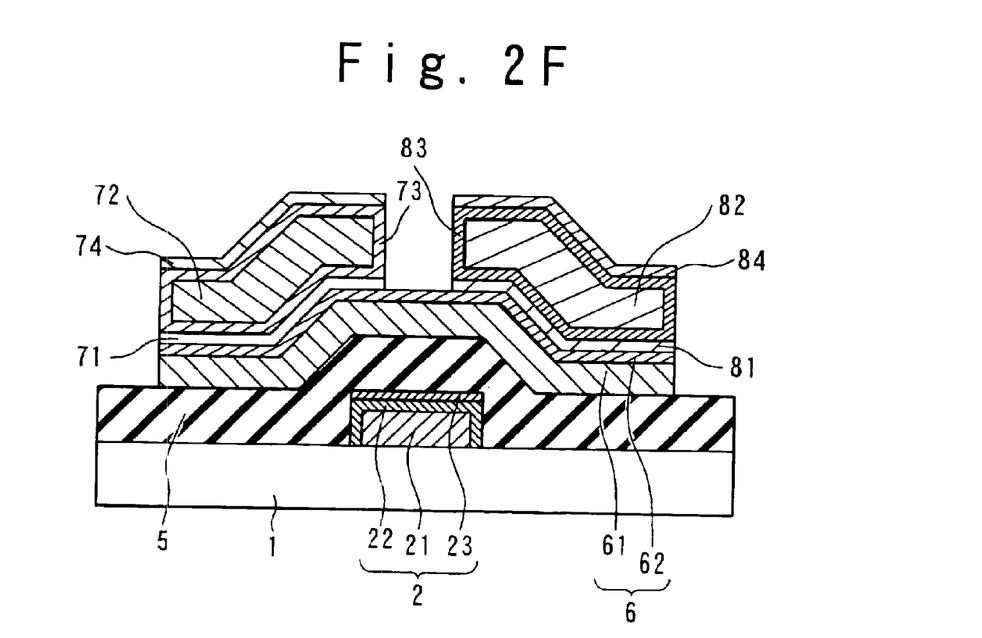

The resist patterns 210 is then stripped off as shown in FIG. 2F.

Figure 2G:
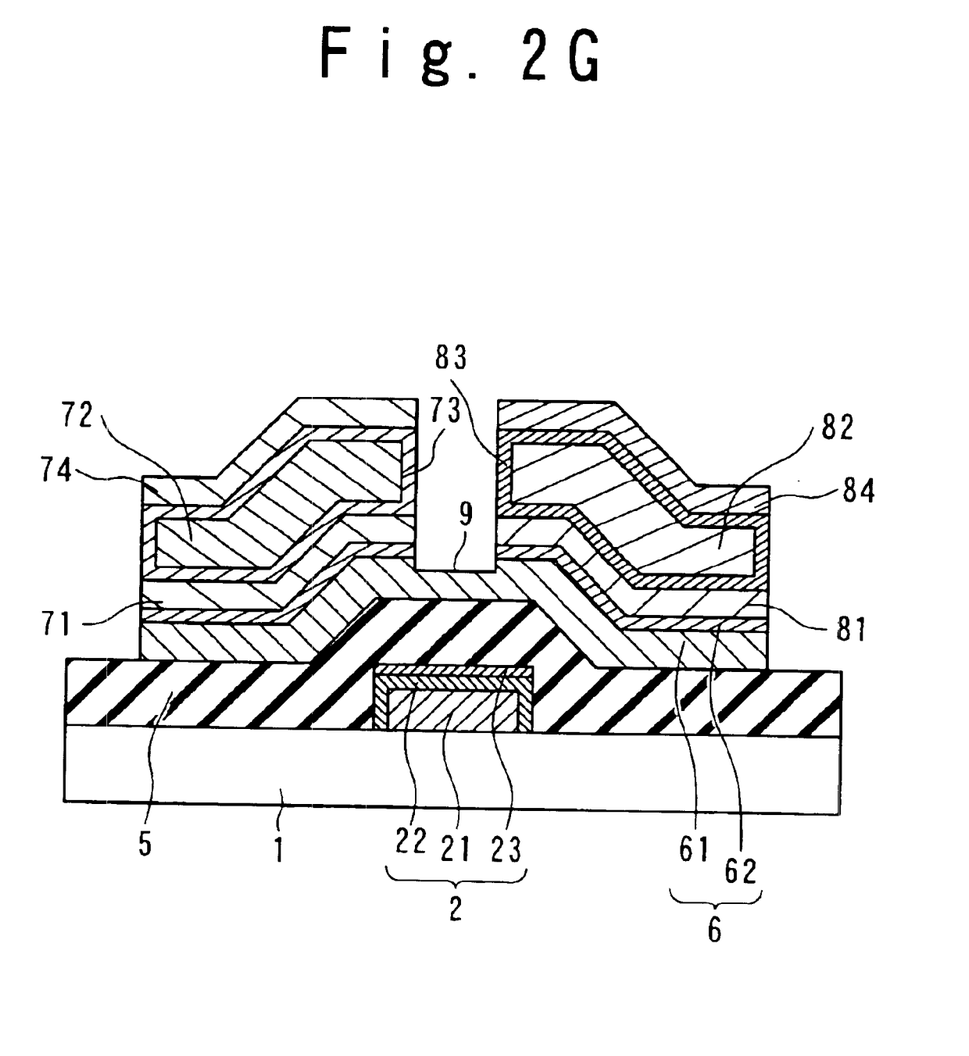

As shown in FIG. 2G, the exposed portion of the heavily doped amorphous silicon film 62 is dry-etched using the source and drain electrodes 7, 8 as a mask. The etchant may additionally include chlorine based chemicals. This dry-etching forms a channel region 9 to complete an inversely staggered TFT. It should be noted that the surface portion of the amorphous silicon film 61 may be etched by this etching. An etchant used for this dry-etching includes fluorine based chemicals, such as fluorocarbon. As mentioned above, the protective layers 73 and 83 are effective for avoiding corrosion potentially caused by fluorine and/or chlorine based chemicals.

In conclusion, the aforementioned method for fabricating interconnections effectively improves corrosion resistance through forming the protective layers 73 and 83 around the core metal layers 72 and 82. The protective layers 73 and 83, which are disposed between the core metal layers 72, and 82 and the refractory metal layers 71, 81, 74, and 84, are also effective for improving heat resistance of the interconnections.

Although the invention has been described in its preferred form with a certain degree of particularity, it is understood that the present disclosure of the preferred form has been changed in the details of construction and the combination and arrangement of parts may be resorted to without departing from the scope of the invention as hereinafter claimed.

What is claimed is:

1. A method of fabricating a semiconductor device including an interconnection, said method comprising:
    forming a metal film stack to cover a substrate; said film stack including:
        a lower refractory metal film over said substrate,
        a lower protective layer of a first compound including metal disposed on an upper surface of said lower refractory metal film,
        a core metal film of said metal on an upper surface of said lower protective layer,
        an upper protective layer of a second compound including said metal disposed on an upper surface of said core metal film, and
        an upper refractory metal film disposed on an upper surface of said upper protective layer;
    patterning said metal film stack; and
    forming a side protective layer of a third compound including said metal on a side of said patterned core metal film.

2. The method according to claim 1, wherein at least one of said first, second, and third compounds is oxide of said metal.

3. The method according to claim 1, wherein at least one of said first, second, and third compounds is nitride of said metal.

4. The method according to claim 1, wherein at least one of said first, second, and third compounds is oxynitride of said metal.

5. The method according to claim 1, wherein said metal is selected from the group consisting of aluminum and aluminum alloy, and wherein said first, second, and third compounds are selected from the group consisting of oxide, nitride, and oxynitride of said metal.

6. The method according to claim 1, wherein said metal is selected from the group consisting of copper, silver, and an alloy thereof, and
wherein said first, second, and third compounds are selected from the group consisting of nitride, and oxynitride of said metal.

7. The method according to claim 1, wherein said patterning includes:
forming a resist pattern on said metal film stack, and
etching said metal film stack using said resist pattern as a mask, and
wherein said forming said side protective layer is implemented before said resist pattern is stripped off.

8. The method according to claim 1, wherein said patterning includes:
forming a resist pattern on said metal film stack,
etching said metal film stack using said resist pattern as a mask, and
stripping off at least a portion of said resist pattern, and
wherein said forming said side protective layer is implemented after said stripping off.

9. The method according to claim 1, further comprising:
forming a semiconductor film stack to cover said substrate; said semiconductor film stack including a semiconductor layer and a heavily doped semiconductor layer disposed on an upper surface of said semiconductor layer, and said metal film stack being patterned so that said patterned metal film stack overlaps said semiconductor film stack;
patterning said semiconductor film stack using said patterned film stack as a mask.

10. The method according to claim 9, wherein said patterning said semiconductor film stack is achieved by using etchant including fluorine.

11. The method according to claim 10, wherein said etchant further includes chlorine.

12. The method according to claim 1, further comprising:
forming a semiconductor film stack to cover said substrate; said semiconductor film stack including a semiconductor layer and a heavily doped semiconductor layer disposed on an upper surface of said semiconductor layer, and
patterning said semiconductor film stack,
wherein said patterning said metal film stack includes:
forming a resist pattern on said metal film stack,
etching said metal film stack using said resist pattern as a mask so that said patterned metal film stack overlaps said semiconductor film stack, and
wherein said patterning said semiconductor film stack is achieved by using said resist pattern as a mask.

13. The method according to claim 12, wherein said patterning said semiconductor film stack is achieved by using etchant including fluorine.

14. The method according to claim 13, wherein said etchant further includes chlorine.

* * * * *